United States Patent
Mahler et al.

(10) Patent No.: US 7,667,337 B2
(45) Date of Patent: Feb. 23, 2010

(54) SEMICONDUCTOR DEVICE WITH CONDUCTIVE DIE ATTACH MATERIAL

(75) Inventors: Joachim Mahler, Regensburg (DE); Thomas Behrens, Wenzenbach (DE); Stefan Landau, Wehrheim (DE); Eduard Knauer, Regensburg (DE); Rupert Fischer, MaxHuette-Haidhof (DE)

(73) Assignee: Infineon Technologies AG, Neubiberg (DE)

( * ) Notice: Subject to any disclaimer, the term of this patent is extended or adjusted under 35 U.S.C. 154(b) by 218 days.

(21) Appl. No.: 11/858,627

(22) Filed: Sep. 20, 2007

(65) Prior Publication Data

US 2009/0079088 A1 Mar. 26, 2009

(51) Int. Cl.
*H01L 23/48* (2006.01)
(52) U.S. Cl. .............. 257/783; 257/E23.018
(58) Field of Classification Search ......... 257/783, 257/E23.018, E23.166
See application file for complete search history.

(56) References Cited

U.S. PATENT DOCUMENTS

| | | | |
|---|---|---|---|
| 4,834,911 A | 5/1989 | Carew | |
| 6,352,775 B1 | 3/2002 | Sasaki et al. | |
| 6,605,236 B1 | 8/2003 | Smith et al. | |
| 7,189,795 B2 | 3/2007 | Burgoyne, Jr. et al. | |
| 7,456,504 B2 * | 11/2008 | Hamren et al. | 257/783 |
| 2004/0225045 A1 | 11/2004 | Forray | |
| 2005/0064194 A1 | 3/2005 | Kumar et al. | |

FOREIGN PATENT DOCUMENTS

| | | |
|---|---|---|
| DE | 69201159 | 11/1995 |
| WO | 9614642 | 5/1996 |
| WO | 9855532 | 12/1998 |

* cited by examiner

*Primary Examiner*—Mark Prenty
(74) *Attorney, Agent, or Firm*—Dicke, Billig & Czaja, PLLC

(57) ABSTRACT

A semiconductor device includes a carrier such as a lead frame, a semiconductor die and an attachment member affixing the semiconductor die to the carrier. The attachment device includes an electrically conductive organic material.

8 Claims, 2 Drawing Sheets

SEMICONDUCTOR DEVICE WITH CONDUCTIVE DIE ATTACH MATERIAL

BACKGROUND

Semiconductor devices, such as integrated circuit (IC) packages, typically include a one or more semiconductor devices arranged on a lead frame or carrier. A die attach material affixes a semiconductor die to the lead frame. Bond wires are attached to bond pads on the semiconductor devices and to lead fingers on the carrier. In other instances, one die is mounted on a lower die and affixed thereto in the same manner. The device is then encapsulated to provide protection and form a housing from which the leads extend.

Known die attach materials have been unsatisfactory in many situations. For instance, reliable electrical and thermal binding of the die to the carrier or lower chip (chip on chip) is often problematic.

Adhesives commonly used for die attach films and pastes have limited electrical conductivity due to the limited quantity of electrically conductive particles—typically silver particles are used but the quantity of the silver particles must be limited to limit brittleness. Additionally, such adhesives are prone to separation between the polymer matrix and the electrically conductive filler particles. Known adhesive films also typically include silver particles to provide electrical conductivity, and thus, exhibit similar disadvantages.

For these and other reasons, there is a need for the present invention.

SUMMARY

In accordance with aspects of the present disclosure, a semiconductor device includes a carrier such as a lead frame, a semiconductor die and an attachment member affixing the semiconductor die to the carrier. The attachment device includes an electrically conductive organic material.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
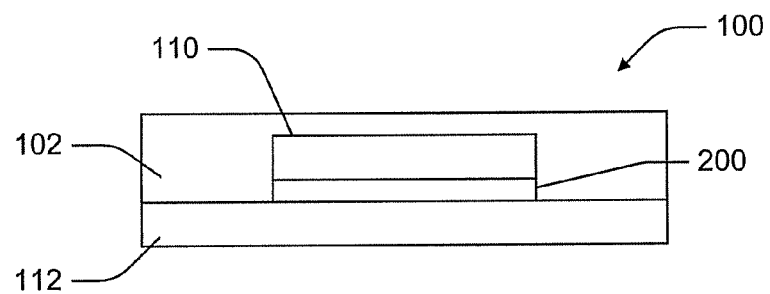
FIG. 1 is a side view conceptually illustrating an electronic device in accordance with embodiments of the present invention.

FIG. 1 is a side view conceptually illustrating an exemplary semiconductor device 100 that includes a semiconductor die 110 mounted on a lead frame or carrier 112. In other embodiments, the semiconductor die 110 is mounted on another die (chip-on-chip). An attachment member 200, such as an adhesive film or paste, is used to affix the die 110 to the carrier 112. Typically, the finished device 100 is encapsulated in a mold compound 102.

In accordance with aspects of the present invention, the attachment member 200 includes an electrically conductive organic material. By using intrinsically electrically conductive polymers in the formulations of the adhesive of the attachment member 200, additional electrically conductive fillers can be reduced or eliminated. Further, such intrinsically conductive polymers can be used in conjunction with conductive metal particles in order to produce an optimal combination of conductive volumes, heat conductivity and connecting polymer matrix or adhesive. Such a formulation thus functions as adhesive matrix, electrical guidance medium and adhesion mediator between additional conductive fillers in one.

Further advantages include eliminating or at least reducing separation of the conductive adhesive formulation. The resulting formulation is very stable, resulting in little or no segregation of particles, and manufacturing processes are relatively simple using these materials. Moreover, the back side of the die is better protected from damages caused by hard metallic fillers, since they can be reduced or eliminated from the adhesive and the electrically conductive polymer is significantly more flexible than commonly used formulations using silver or carbon-based fillers. Mechanical reliability is improved due to increased flexibility of the polymer matrix resulting from fewer hard filler required to realize the desired electrical conductivity. Temperature stability is improved, and electrically conductive polymers generally have a low tendency for hydrolyzing. Extremely thin (<1 μm) conductive adhesive layers are possible with low resistance.

Thus, the use of such electrically conductive polymers in electrically conductive adhesive pastes and/or adhesive films accomplishes electrical and thermal binding of the chip on a metallic system support, such as a lead frame or metal-coated substrate. Suitable conductive polymers include Polythiophene, Polypyrrole, Polysulfone, Polyaniline and Polyindophenine.

Such polymers provide a high thermal stability as well as a high specific conductivity with sufficient doping. A suitable conductive polymer is Poly-(3,4-ethylenedioxythiophene), available under the trade name Baytron M. Another alternative is the substance class of the Polyindophenine, which are hydrolysis and temperature stable and are intrinsically electrically conductive without dopants.

Figure 2:
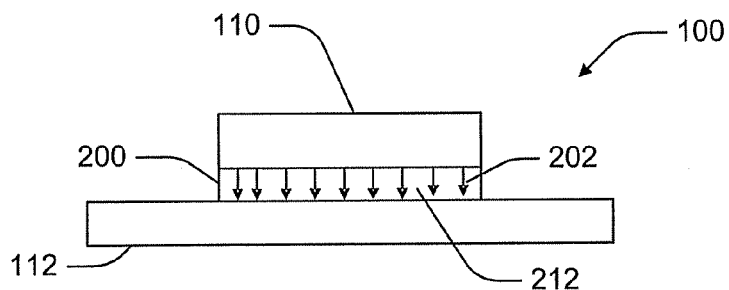
FIG. 2 is a side view conceptually illustrating portions an electronic device in accordance with embodiments of the present invention.

FIG. 2 conceptually illustrates portions of an embodiment of the semiconductor device 100 in accordance with aspects of the present invention. In the embodiment of FIG. 2, the attachment member 200 is an adhesive film or paste, wherein the polymer matrix of the adhesive includes an electrically conductive polymer 212. Arrows 202 illustrate current flow through the attachment member 200 from the semiconductor die 110 to the chip carrier 112. Such a configuration is suitable in devices requiring a relatively small electrical conductivity.

Figure 3:
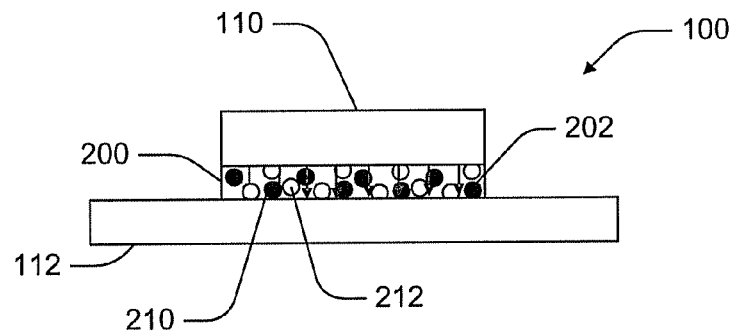
FIG. 3 is a side view conceptually illustrating portions an electronic device in accordance with another embodiment of the present invention.

FIG. 3 illustrates another exemplary embodiment in which the polymer matrix of the attachment member 200 includes electrically conductive filler particles 210 and electrically conductive polymer particles 212. Metals, such as sliver, are suitable for the electrically conductive filler particles 210. In exemplary implementations of such an embodiment, the electrically conductive polymer particles 212 are mixed into the adhesive polymer matrix 200 filled with the conductive particles 210, resulting in increased electrical conductivity. Moreover, thermal-mechanical stress is reduced due to increased elasticity of the adhesive, resulting in improved reliability overall.

Figure 4:
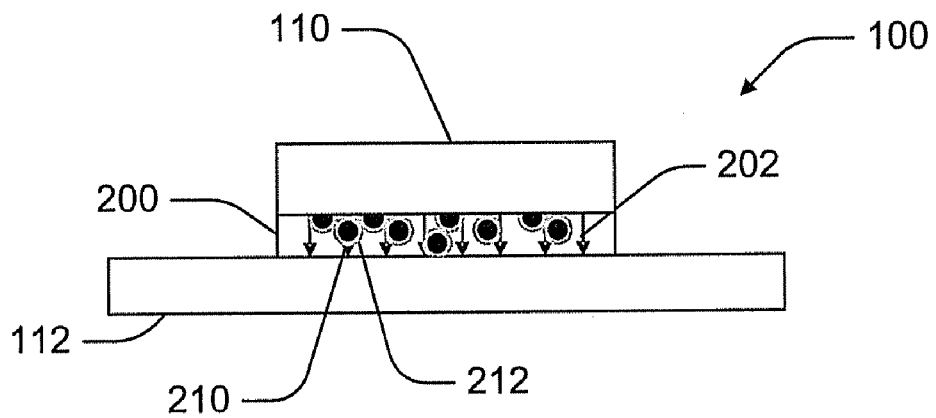
FIG. 4 is a side view conceptually illustrating portions an electronic device in accordance with a further embodiment of the present invention.

In FIG. 4, an embodiment is illustrated in which the attachment member 200 includes a polymer adhesive matrix with electrically conductive filler particles 210 coated with an electrically conductive polymer 212. This provides a greater electrical conductivity, with the conductive polymer 212 coating serving simultaneously as an electrical guidance medium and adhesion mediator between the conductive particles and the adhesive matrix.

Figure 5:
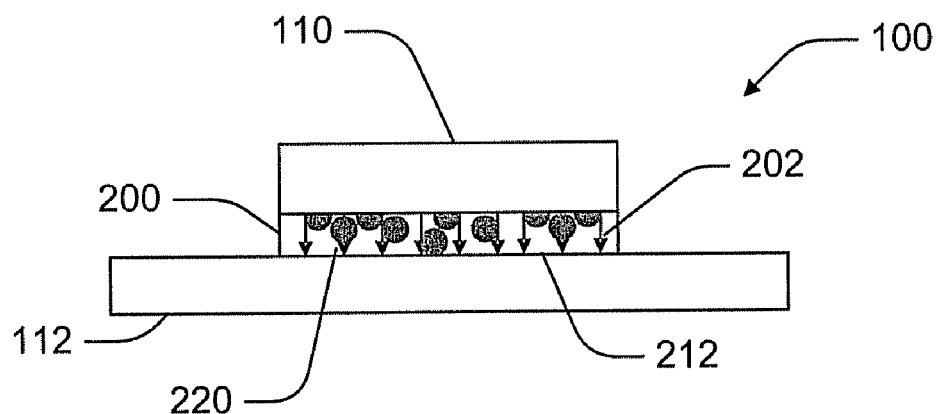
FIG. 5 is a side view conceptually illustrating portions an electronic device in accordance with yet another embodiment of the present invention.

FIG. 5 illustrates yet another embodiment, where the attachment member 200 includes electrically insulating filler particles 220 in an electrically conductive polymer matrix 212. In certain embodiments, the electrically insulating filler particles 220 are thermally conductive. This arrangement is good for applications requiring small electrical and high thermal conductivity. Carbon based materials such as diamond, aluminum nitride, beryllium oxide, boron nitride, etc. are suitable thermally conductive, electrically insulating materials.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a carrier;
    a semiconductor die; and
    an attachment member affixing the semiconductor die to the carrier, the attachment member including an electrically conductive organic material having electrically conductive filler particles coated with an electrically conductive polymer in a polymer adhesive matrix.

2. The semiconductor device of claim 1, wherein the carrier is a second semiconductor die.

3. The semiconductor device of claim 1, wherein the attachment member includes an adhesive film.

4. The semiconductor device of claim 1, wherein the attachment member includes an adhesive paste.

5. A method for producing a semiconductor device, comprising:
    providing a carrier;
    providing a semiconductor die;
    applying an attachment member including an electrically conductive organic material having electrically conductive filler particles coated with an electrically conductive polymer in a polymer adhesive matrix to at least one of the carrier or the semiconductor die to affix the semiconductor die to the carrier.

6. The method of claim 5, wherein providing a carrier comprises providing a second semiconductor die, and wherein the attachment member affixes the first semiconductor die to the second semiconductor die.

7. The method of claim 5, wherein applying the attachment member includes applying an adhesive film to at least one of the carrier or the semiconductor die.

8. The method of claim 5, wherein applying the attachment member includes applying an adhesive paste to at least one of the carrier or the semiconductor die.

* * * * *